United States Patent
Kim (10) Patent No.: US 8,242,492 B2
(45) Date of Patent: Aug. 14, 2012

(54) ORGANIC LIGHT EMITTING DIODE DISPLAY

(75) Inventor: Changnam Kim, Paju-si (KR)

(73) Assignee: LG Display Co., Ltd., Seoul (KR)

(*) Notice: Subject to any disclaimer, the term of this patent is extended or adjusted under 35 U.S.C. 154(b) by 126 days.

(21) Appl. No.: 12/846,434

(22) Filed: Jul. 29, 2010

(65) Prior Publication Data

US 2011/0260166 A1 Oct. 27, 2011

(30) Foreign Application Priority Data

Apr. 21, 2010 (KR) .................. 10-2010-0036772

(51) Int. Cl.
*H01L 51/00* (2006.01)
*H01J 1/62* (2006.01)
(52) U.S. Cl. .......... 257/40; 257/E51.018; 313/504
(58) Field of Classification Search .......... 257/40, 257/59, 98, E51.018; 313/503, 504, 505
See application file for complete search history.

(56) References Cited

U.S. PATENT DOCUMENTS

| 6,175,345 | B1 * | 1/2001 | Kuribayashi et al. ......... 345/76 |
| 2006/0055313 | A1 * | 3/2006 | Bae et al. .................. 313/500 |
| 2009/0058280 | A1 * | 3/2009 | Jo et al. ..................... 313/504 |

* cited by examiner

*Primary Examiner* — A. Sefer
*Assistant Examiner* — Nikolay Yushin
(74) *Attorney, Agent, or Firm* — McKenna Long & Aldridge, LLP

(57) ABSTRACT

An organic light emitting diode display includes a substrate including a display area and a non-display area, subpixels arranged in the display area in a matrix form, a contact electrode that is formed in the non-display area, transfers a power received from the outside, and includes at least one of electrodes included in each subpixel, and a contact unit that includes at least one of insulating layers included in each subpixel and exposes a portion of the contact electrode. An upper electrode included in each subpixel is formed in the display area and the non-display area and is electrically connected to the contact electrode through the contact unit.

8 Claims, 12 Drawing Sheets

ORGANIC LIGHT EMITTING DIODE DISPLAY

This application claims the benefit of Korean Patent Application No. 10-2010-0036772 filed on Apr. 21, 2010, which is hereby incorporated by reference.

BACKGROUND OF THE INVENTION

1. Field of the Invention

Embodiments of the invention relate to an organic light emitting diode (OLED) display.

2. Description of the Related Art

An organic light emitting element used in an organic light emitting diode (OLED) display has a self-emission structure in which a light emitting layer is formed between two electrodes on a substrate. The OLED display may be classified into a top emission type OLED display, a bottom emission type OLED display, and a dual emission type OLED display depending on an emitting direction of light. The OLED display may be classified into a passive matrix type OLED display and an active matrix type OLED display depending on a driving manner.

In the OLED display, each of a plurality of subpixels includes a transistor unit and a light emitting unit. The transistor unit includes a switching transistor, a driving transistor, and a capacitor, and the light emitting unit includes a lower electrode connected to the driving transistor, an organic light emitting layer, and an upper electrode. When a scan signal, a data signal, a power, etc. are supplied to the plurality of subpixels arranged in a matrix form, the selected subpixels emit light to thereby display an image.

In the OLED display, a contact electrode is formed in a non-display area so as to supply a power to upper electrodes of the subpixels formed in a display area. Further, the contact electrode is electrically connected to the upper electrode in a formation process of the upper electrode. However, in a related art OLED display, a smooth contact between the contact electrode formed in the non-display area and the upper electrode formed in the display area is not achieved, and a short circuit between the contact electrode and the upper electrode is generated. Further, the contact electrode may be damaged because of a concentration of an electric filed on an upper edge of the contact electrode.

SUMMARY OF THE INVENTION

In one aspect, there is an organic light emitting diode display comprising a substrate including a display area and a non-display area, subpixels arranged in the display area in a matrix form, a contact electrode that is formed in the non-display area, transfers a power received from the outside, and includes at least one of electrodes included in each subpixel, and a contact unit including at least one of insulating layers included in each subpixel, the contact unit exposing a portion of the contact electrode, wherein an upper electrode included in each subpixel is formed in the display area and the non-display area and is electrically connected to the contact electrode through the contact unit.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail embodiments of the invention examples of which are illustrated in the accompanying drawings.

Figure 1:
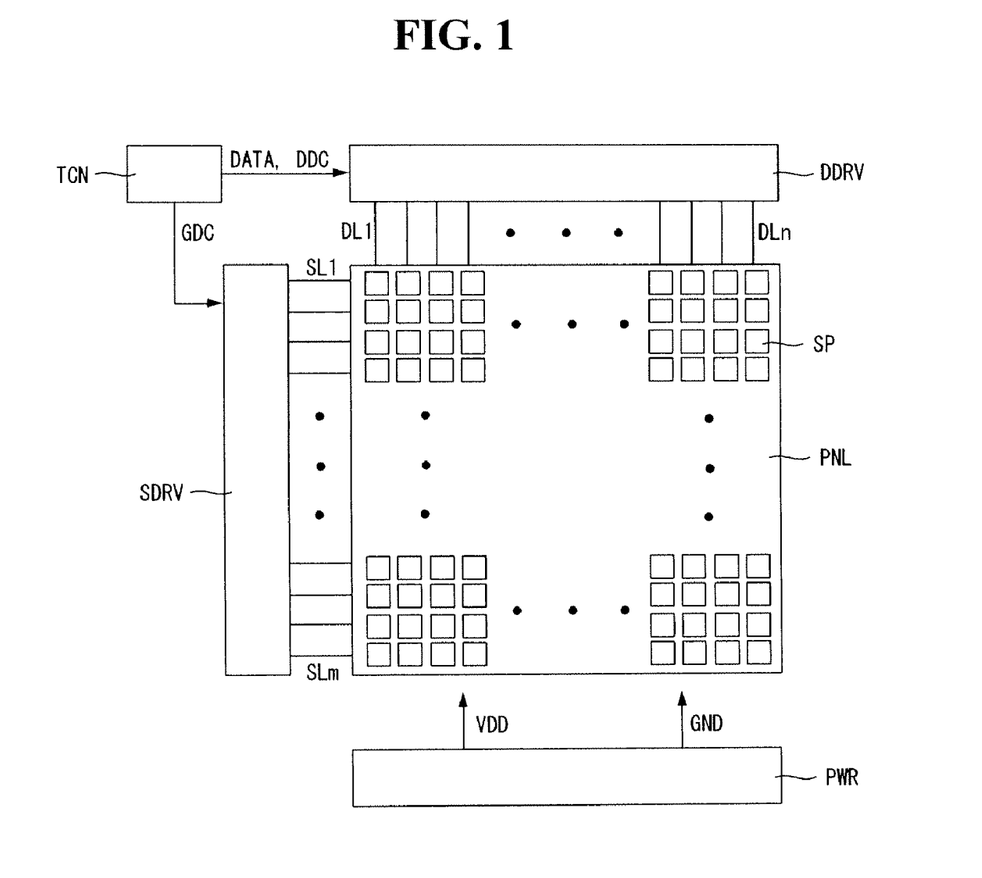
FIG. 1 is a block diagram schematically illustrating an organic light emitting diode (OLED) display.
Figure 2:
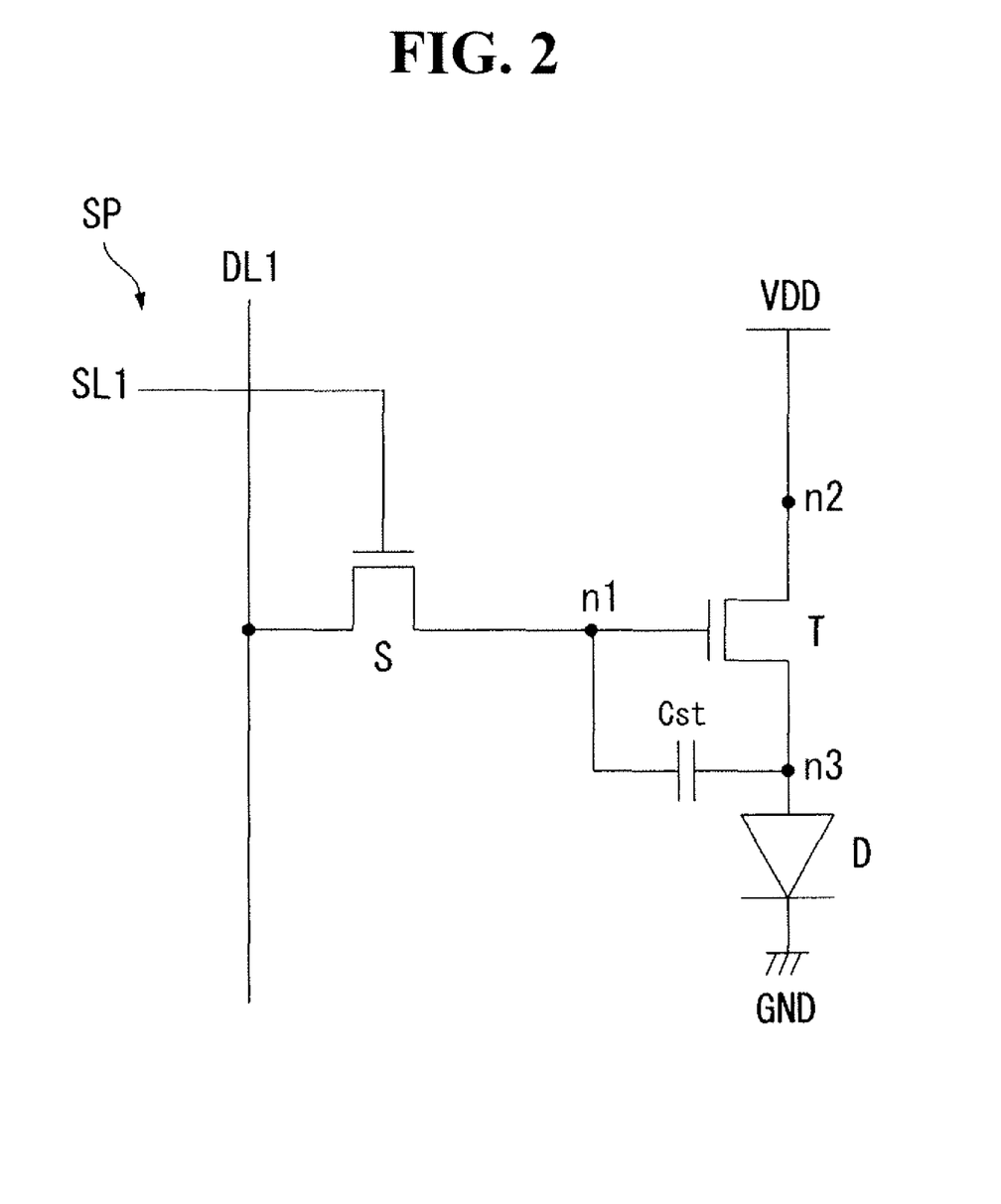
FIG. 2 illustrates a circuit configuration of a subpixel shown in FIG. 1.
Figure 3:
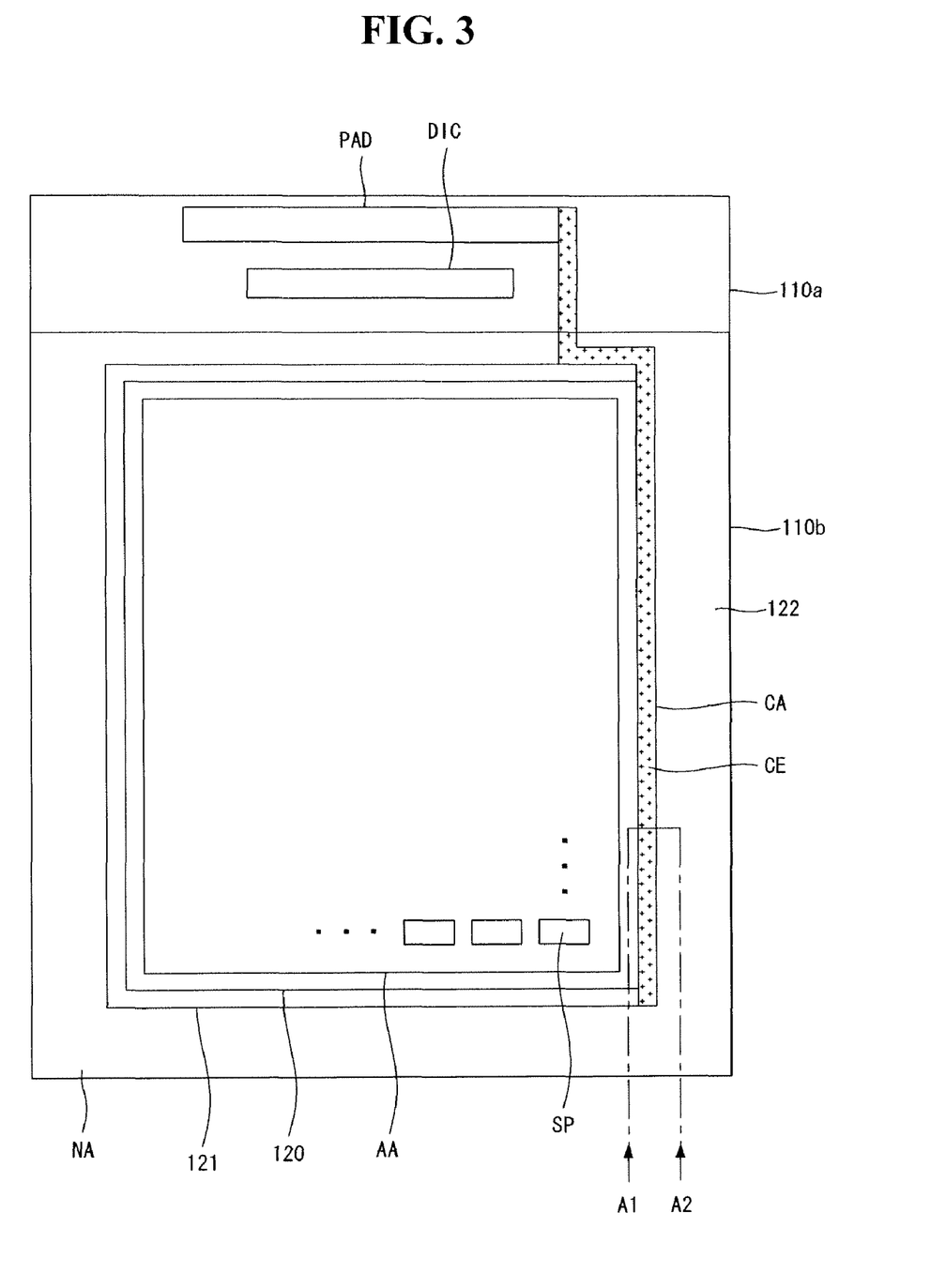
FIG. 3 is a plane view schematically illustrating an OLED display shown in FIG. 1.
Figure 4:
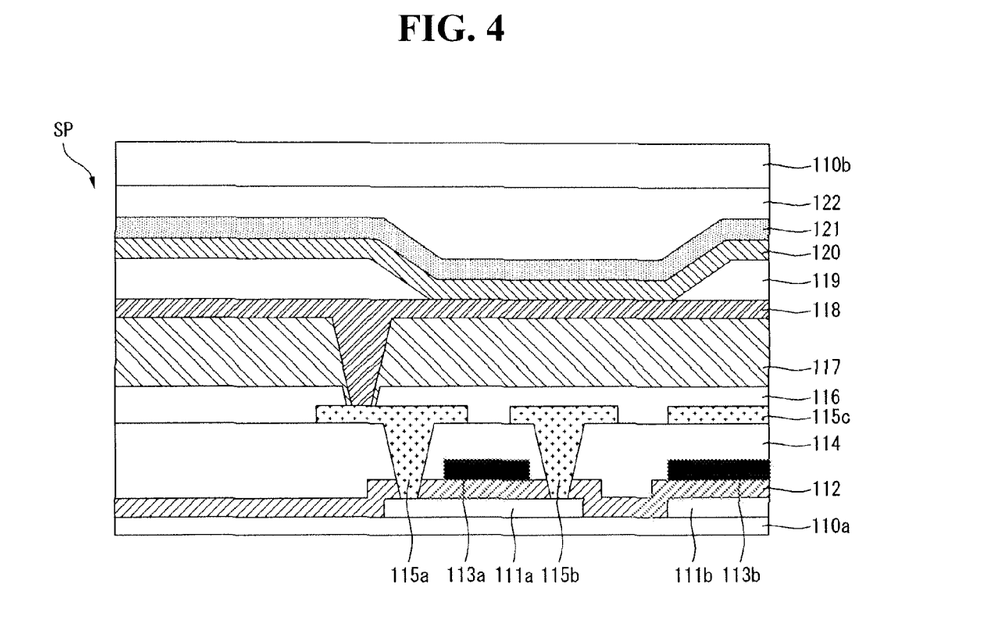
FIG. 4 is a cross-sectional view of a subpixel shown in FIG. 3.

FIG. 1 is a block diagram schematically illustrating an organic light emitting diode (OLED) display. FIG. 2 illustrates a circuit configuration of a subpixel shown in FIG. 1. FIG. 3 is a plane view schematically illustrating the OLED display shown in FIG. 1. FIG. 4 is a cross-sectional view of a subpixel shown in FIG. 3.

As shown in FIGS. 1 and 2, the OLED display includes a timing controller TCN, a data driver DDRV, a scan driver SDRV, a power supply unit PWR, and a panel PNL.

The timing controller TCN controls the data driver DDRV using a data driving signal DDC, and at the same time controls the scan driver SDRV using a gate driving signal GDC. The timing controller TCN converts a video signal received from the outside into a data signal DATA and supplies the data signal DATA to the data driver DDRV. The timing controller TCN may be mounted on a printed circuit board (PCB) connected to the panel PNL in an integrated circuit (IC) form.

The data driver DDRV supplies the data signal DATA to subpixels SP through data lines DL1 to DLn positioned on the panel PNL under the control of the timing controller TCN. The data driver DDRV may be mounted on the panel PNL in an IC form.

The scan driver SDRV supplies a scan signal to the subpixels SP through scan lines SL1 to SLm positioned on the panel PNL under the control of the timing controller TCN. The scan driver SDRV may be mounted on the panel PNL in an IC form or in a gate-in-panel (GIP) form.

The power supply unit PWR produces a high potential power VDD and a low potential power GND and supplies them to at least one of the timing controller TCN, the data driver DDRV, the scan driver SDRV, and the panel PNL. The power supply unit PWR may be mounted on the printed circuit board connected to the panel PNL.

The panel PNL includes the plurality of subpixels SP that are arranged on a substrate in a matrix form. The subpixels SP may be arranged in a passive matrix form or an active matrix form. As shown in FIG. 2, when the subpixels SP are arranged in the active matrix form, each of the subpixels SP may have a 2T1C structure (i.e., including two transistors T and one capacitor C) including a switching transistor S, a driving transistor T, a capacitor Cst, and an organic light emitting diode D. Alternatively, each subpixel SP may have a structure adding a transistor and a capacitor to the 2T1C structure. In the 2T1C structure, the switching transistor S, the driving transistor T, and the capacitor Cst may be defined as a transistor unit, and the organic light emitting diode D may be defined as a light emitting unit. A connection relationship between components constituting the subpixel SP having the 2T1C structure is described below with reference to FIG. 2. As shown in FIG. 2, a gate electrode of the switching transistor S is connected to the scan line SL1 to which the scan signal is supplied, one terminal of the switching transistor S is connected to the data line DL1 to which the data signal DATA is supplied, and the other terminal of the switching transistor S is connected to a first node n1. A gate electrode of the driving transistor T is connected to the first node n1, one terminal of the driving transistor T is connected to a second node n2 connected to a power supply line VDD to which the high potential power is supplied, and the other terminal of the driving transistor T is connected to a third node n3. One terminal of the capacitor Cst is connected to the first node n1, and the other terminal of the capacitor Cst is connected to the third node n3. A lower electrode of the organic light emitting diode D is connected to the third node n3, and an upper electrode of the organic light emitting diode D is connected to a ground line GND to which the low potential power is supplied.

Although an example where the transistors S and T included in the subpixel SP are of an n-type is described above, the transistors S and T may be of a p-type. The transistors S and T may be an amorphous silicon (a-Si) transistor, a polysilicon transistor, an oxide transistor, an organic transistor, etc. The transistors S and T may have a bottom gate structure as well as a top gate structure. The high potential power supplied through the power supply line VDD may be higher than the low potential power supplied through the ground line GND. The high potential power and the low potential power are supplied by the power supply unit PWR.

The above-described subpixel SP may operate as follows. As shown in FIG. 2, when the scan signal is supplied through the scan line SL1, the switching transistor S is turned on. Next, when the data signal DATA supplied through the data line DL1 is supplied to the first node n1 via the turned-on switching transistor S, the data signal DATA is stored in the capacitor Cst as a data voltage. Next, when the scan signal is cut off and the switching transistor S is turned off, the driving transistor T is driven in accordance with the data voltage stored in the capacitor Cst. Next, when the high potential power supplied through the power supply line VDD flows through the ground line GND, the organic light emitting diode D emits one of red, green, and blue light. The driving method illustrated in FIG. 2 is only one example of the driving method of the subpixel for a help of an understanding of a circuit configuration of the subpixel, and the embodiment of the invention is not limited to the driving method of the subpixel SP illustrated in FIG. 2. Other driving methods of the subpixel may be used for the embodiment of the invention.

As shown in FIGS. 3 and 4, the OLED display includes a pad unit PAD formed on a substrate 110a constituting the panel, a driving IC DIC, a display area AA, and a non-display area NA. The substrate 110a constituting the panel is encapsulated with a seal substrate 110b using an encapsulation material 122, for example, a front sealant, thereby protecting the subpixels SP formed in the display area AA from the outside. The pad unit PAD is electrically connected to an external printed circuit board and transfers various signals generated by the timing controller, etc. to the panel. The substrate 110a constituting the panel is defined as the display area AA displaying an image and the non-display area NA not displaying the image. The subpixels SP arranged in the matrix form are formed on the substrate 110a defined as the display area AA, and a contact electrode CE transferring a power received from the outside is formed on the substrate 110a defined as the non-display area NA. Although it is not shown, data lines and scan lines connected to the driving IC DIC, a power supply line and a ground line connected to the pad unit PAD, etc. are formed on the substrate 110a defined as the non-display area NA. Although the driving IC DIC shown in FIG. 3 has the structure in which the data driver DDRV and the scan driver SDRV shown in FIG. 1 are formed on one chip, it is not limited thereto. Further, the contact electrode CE may be selected as the ground line or the power supply line based on the structure of the lower electrode and the upper electrode included in the subpixel SP. In the embodiment of the invention, the contact electrode CE is formed on one surface of the display area AA. However, the contact electrode CE may be formed to surround two, three, or four surfaces of the display area AA.

The structure of the subpixel SP is below described in detail.

As shown in FIG. 4, first and second active layers 111a and 111b each including a source region, a channel region, and a drain region are formed on the substrate 110a. The source region and the drain region of each of the first and second active layers 111a and 111b may be are doped with p-type impurities or n-type impurities. A first insulating layer 112 is formed on the substrate 110a to cover the first and second active layers 1 1 1a and 111b. The first insulating layer 112 may be formed of silicon oxide (SiOx), silicon nitride ($SiN_x$), or other materials. First and second gate electrodes 113a and 113b are formed on the first insulating layer 112 at locations corresponding to the first and second active layers 111a and 111b. A second insulating layer 114 is formed on the first insulating layer 112 to cover the first and second gate electrodes 113a and 113b and to expose a portion of the first active layer 111a. The second insulating layer 114 may be formed of silicon oxide (SiOx), silicon nitride ($SiN_x$), or other materials. Source and drain electrodes 115a and 115b connected to the exposed portion of the first active layer 111a are formed on the second insulating layer 114. A capacitor electrode 115c is formed on the second insulating layer 114 in the same manner as the source and drain electrodes 115a and 115b. The capacitor electrode 115c and the second gate electrode 113b form a capacitor. A third insulating layer 116 is formed on the second insulating layer 114 to cover the source and drain electrodes 115a and 115b and the capacitor electrode 115c. The third insulating layer 116 may be formed of silicon oxide (SiOx), silicon nitride ($SiN_x$), or other materials. A fourth insulating layer 117 is formed on the third insulating layer 116 to expose a portion of the source and drain electrodes 115a and 115b. The fourth insulating layer 117 may be formed of silicon oxide (SiOx), silicon nitride (SiN$_x$), or other materials. A lower electrode 118 connected to the exposed portion of the source and drain electrodes 115a and 115b is formed on the fourth insulating layer 117. The lower electrode 118 may be selected as an anode electrode or a cathode electrode. When the lower electrode 118 is selected as the anode electrode, the anode electrode 118 may be formed of a transparent metal material such as indium-tin-oxide (ITO) and indium-zinc-oxide (IZO), or other materials. A fifth insulating layer 119 is formed on the lower electrode 118 to expose a portion of the lower electrode 118. The fifth insulating layer 119 may be formed of an organic material such as benzocyclobutene (BCB)-based resin, acrylic resin, and polyimide resin. Other materials may be used. An organic light emitting layer 120 is formed on the fifth insulating layer 119 to cover the exposed portion of the lower electrode 118. The organic light emitting layer 120 may include a hole transport layer, a hole injection layer, a light emitting layer, an electron injection layer, and an electron transport layer. In addition, the organic light emitting layer 120 may further include other functional layers. The organic light emitting layer 120 may emit at least one of red, green, and blue light. At least one of the layers included in the organic light emitting layer 120 is formed outside the display area AA as a dummy layer as shown in FIG. 3. An upper electrode 121 is formed on the organic light emitting layer 120. The upper electrode 121 may be selected as an anode electrode or a cathode electrode. When the upper electrode 121 is selected as the cathode electrode, the cathode electrode 121 may be formed of an opaque metal material such as aluminum (Al) and aluminum neodymium (AlNd). Other materials may be used. As shown in FIG. 3, the upper electrode 121 is formed in the display area AA and the non-display area NA and is electrically connected to the contact electrode CE through the contact unit CA. Hence, the upper electrode 121 may receive the high potential power or the low potential power through the electrical connection between the upper electrode 121 and the contact electrode CE. In the embodiment of the invention, the contact electrode CE is at least one electrode formed in the non-display area NA. The contact unit CA is formed in the non-display area NA and is an insulating layer that allows a portion of the contact electrode CE to be gently inclined and exposes the gently inclined portion of the contact electrode CE.

Hereinafter, various embodiments of the structure of the contact electrode CE and the contact unit CA are described <First Exemplary Embodiment>

Figure 5:
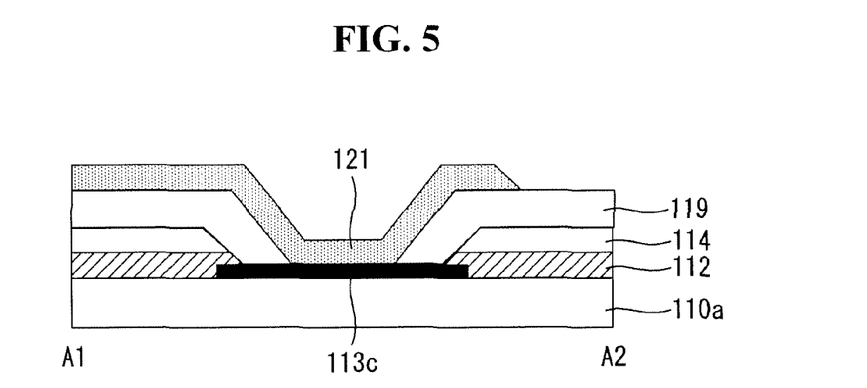
FIGS. 5 to 7 illustrate the structure of a contact unit and a contact electrode according to a first exemplary embodiment of the invention.
Figure 6:
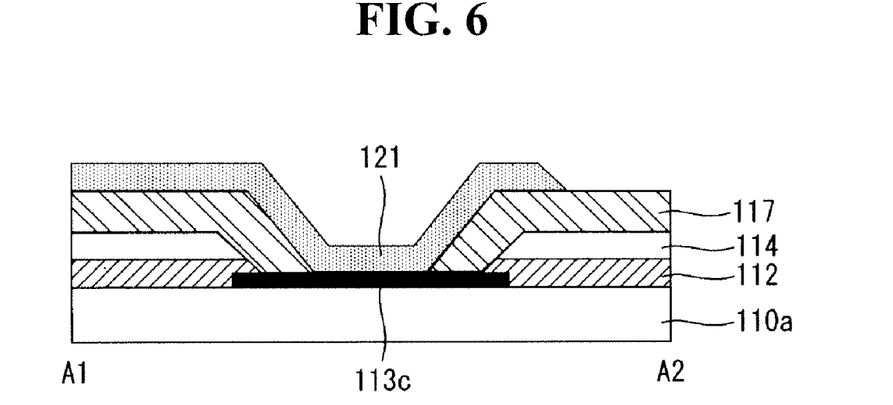
Figure 7:
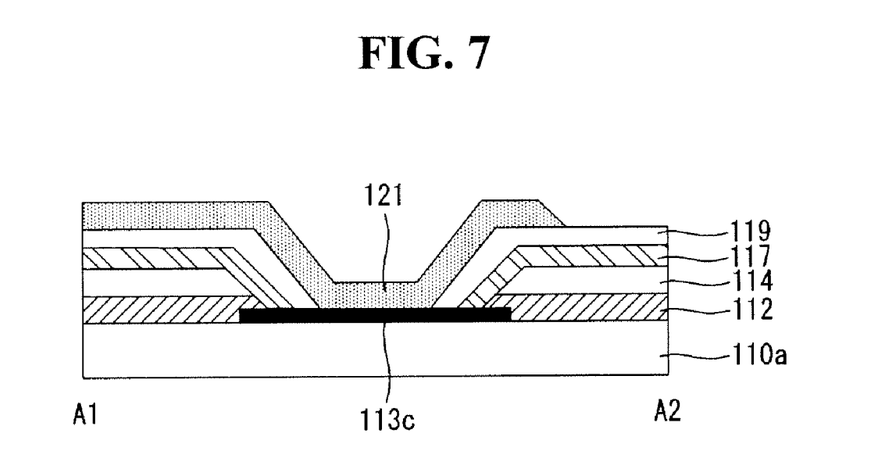

FIGS. 5 to 7 illustrate the structure of a contact unit and a contact electrode according to a first exemplary embodiment of the invention.

As shown in FIGS. 3 and 5, a contact electrode 113c (CE) is formed on the substrate 110a defined as the non-display area NA using the same process and the same material as the first and second gate electrodes 113a and 113b. Contact units 112, 114 and 119 (CA) include three insulating layers. The three insulating layers are formed using the same process and the same material as the first, second, and the fifth insulating layers 112, 114 and 119. The contact units 112, 114 and 119 (CA) cover an edge portion of the contact electrode 113c (CE) and expose a middle portion of the contact electrode 113c (CE).

As shown in FIGS. 3 and 6, the contact electrode 113c (CE) is formed on the substrate 110a defined as the non-display area NA using the same process and the same material as the first and second gate electrodes 113a and 113b. Contact units 112, 114 and 117 (CA) include three insulating layers. The three insulating layers are formed using the same process and the same material as the first, second, and the fourth insulating layers 112, 114 and 117. The contact units 112, 114 and 117 (CA) cover an edge portion of the contact electrode 113c (CE) and expose a middle portion of the contact electrode 113c (CE).

As shown in FIGS. 3 and 7, the contact electrode 113c (CE) is formed on the substrate 110a defined as the non-display area NA using the same process and the same material as the first and second gate electrodes 113a and 113b. Contact units 112, 114, 117 and 119 (CA) include four insulating layers. The four insulating layers are formed using the same process and the same material as the first, second, fourth, and fifth insulating layers 112, 114, 117 and 119. The contact units 112, 114, 117 and 119 (CA) cover an edge portion of the contact electrode 113c (CE) and expose a middle portion of the contact electrode 113c (CE).

Because the upper electrode 121 is electrically connected to the contact electrode 113c (CE) through the middle portion of the contact electrode 113c (CE) having a single-layered structure based on the above-described structure, the upper electrode 121 may smoothly contact the contact electrode 113c (CE) and an electric field may be prevented from being concentrated on an upper edge of the contact electrode 113c (CE).

<Second Exemplary Embodiment>

Figure 8:
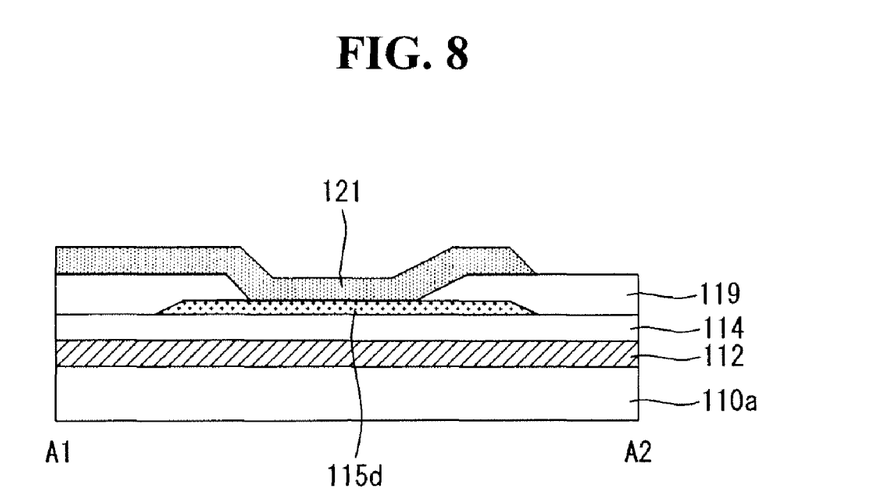
FIGS. 8 to 10 illustrate the structure of a contact unit and a contact electrode according to a second exemplary embodiment of the invention.
Figure 9:
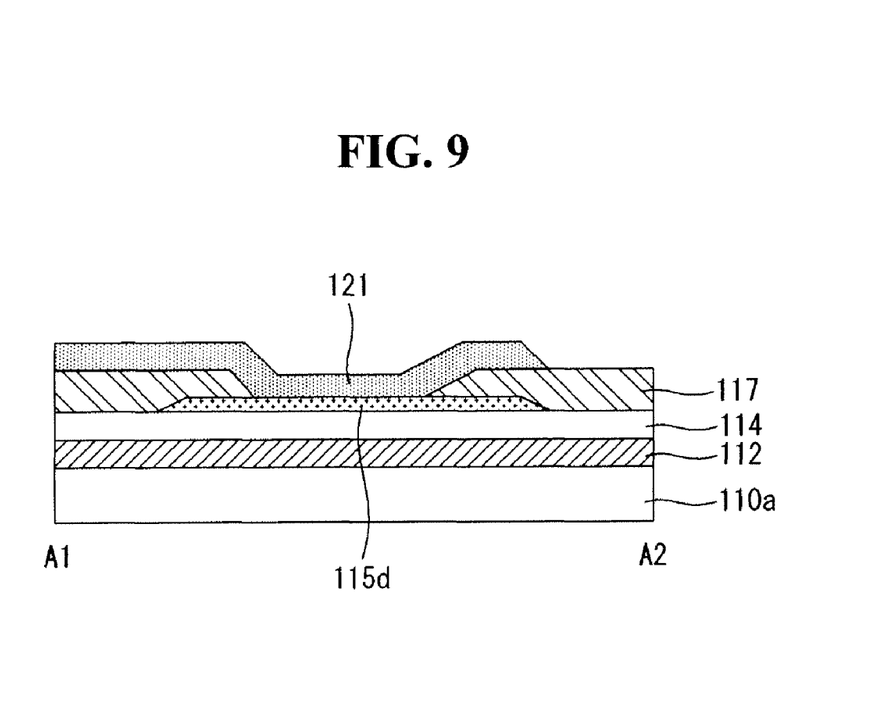
Figure 10:
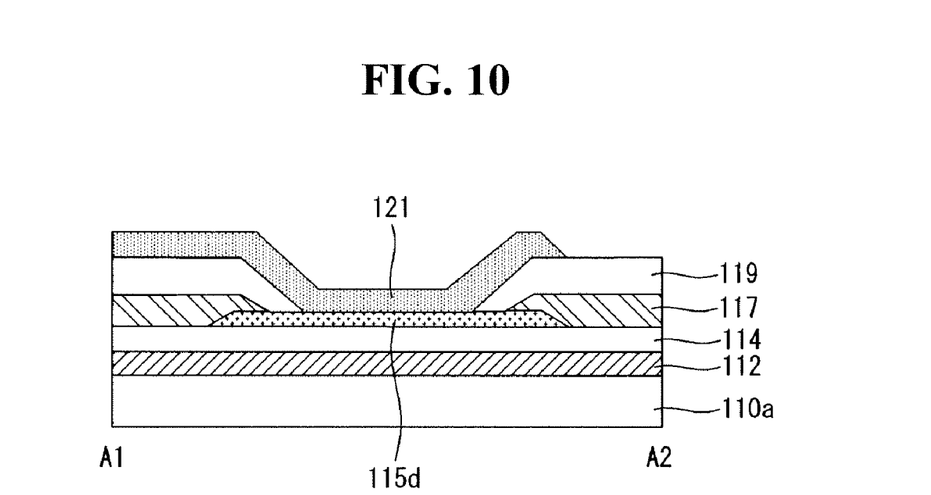

FIGS. 8 to 10 illustrate the structure of a contact unit and a contact electrode according to a second exemplary embodiment of the invention.

As shown in FIGS. 3 and 8, a contact electrode 115d (CE) is formed on the substrate 110a defined as the non-display area NA using the same process and the same material as the source and drain electrodes 115a and 115b. Because the contact electrode 115d (CE) is formed using the same process and the same material as the source and drain electrodes 115a and 115b, two insulating layers 112 and 114 are formed under the contact electrode 115d (CE). The two insulating layers 112 and 114 are the first insulating layer 112 and the second insulating layer 114. A contact unit 119 (CA) includes one insulating layer. The one insulating layer is formed using the same process and the same material as the fifth insulating layer 119. The contact unit 119 (CA) covers an edge portion of the contact electrode 115d (CE) and exposes a middle portion of the contact electrode 115d (CE).

As shown in FIGS. 3 and 9, the contact electrode 115d (CE) is formed on the substrate 110a defined as the non-display area NA using the same process and the same material as the source and drain electrodes 115a and 115b. Because the contact electrode 115d (CE) is formed using the same process and the same material as the source and drain electrodes 115a and 115b, two insulating layers 112 and 114 are formed under the contact electrode 115d (CE). The two insulating layers 112 and 114 are the first insulating layer 112 and the second insulating layer 114. A contact unit 117 (CA) includes one insulating layer. The one insulating layer is formed using the same process and the same material as the fourth insulating layer 117. The contact unit 117 (CA) covers an edge portion of the contact electrode 115d (CE) and exposes a middle portion of the contact electrode 115d (CE).

As shown in FIGS. 3 and 10, the contact electrode 115d (CE) is formed on the substrate 110a defined as the non-display area NA using the same process and the same material as the source and drain electrodes 115a and 115b. Because the contact electrode 115d (CE) is formed using the same process and the same material as the source and drain electrodes 115a and 115b, two insulating layers 112 and 114 are formed under the contact electrode 115d (CE). The two insulating layers 112 and 114 are the first insulating layer 112 and the second insulating layer 114. Contact units 117 and 119 (CA) include two insulating layers. The two insulating layers are formed using the same process and the same material as the fourth and fifth insulating layers 117 and 119. The contact unit 117 and 119 (CA) cover an edge portion of the contact electrode 115*d* (CE) and expose a middle portion of the contact electrode 115*d* (CE).

Because the upper electrode 121 is electrically connected to the contact electrode 115*d* (CE) through the middle portion of the contact electrode 115*d* (CE) having a single-layered structure based on the above-described structure, the upper electrode 121 may smoothly contact the contact electrode 115*d* (CE) and an electric field may be prevented from being concentrated on an upper edge of the contact electrode 115*d* (CE).

<Third Exemplary Embodiment>

Figure 11:
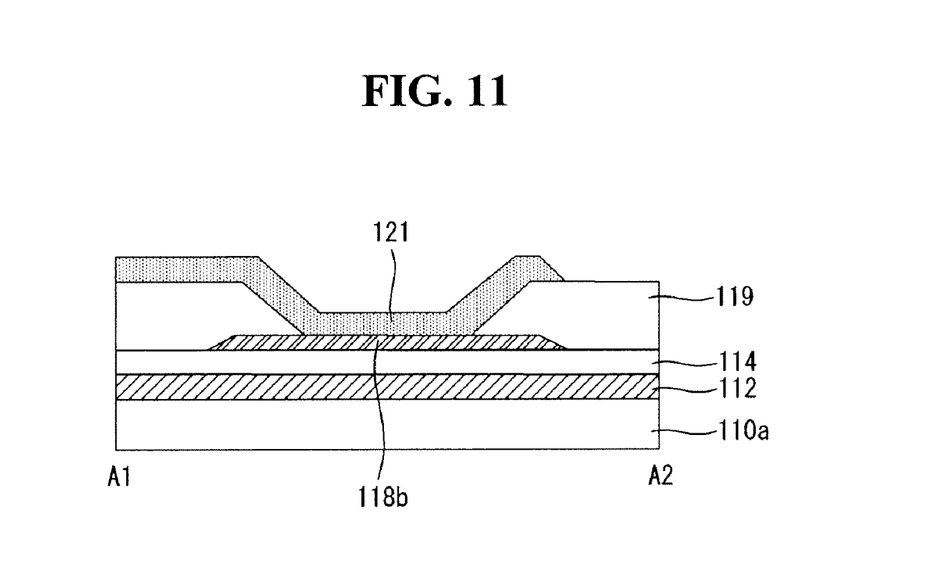
FIGS. 11 and 12 illustrate the structure of a contact unit and a contact electrode according to a third exemplary embodiment of the invention.
Figure 12:
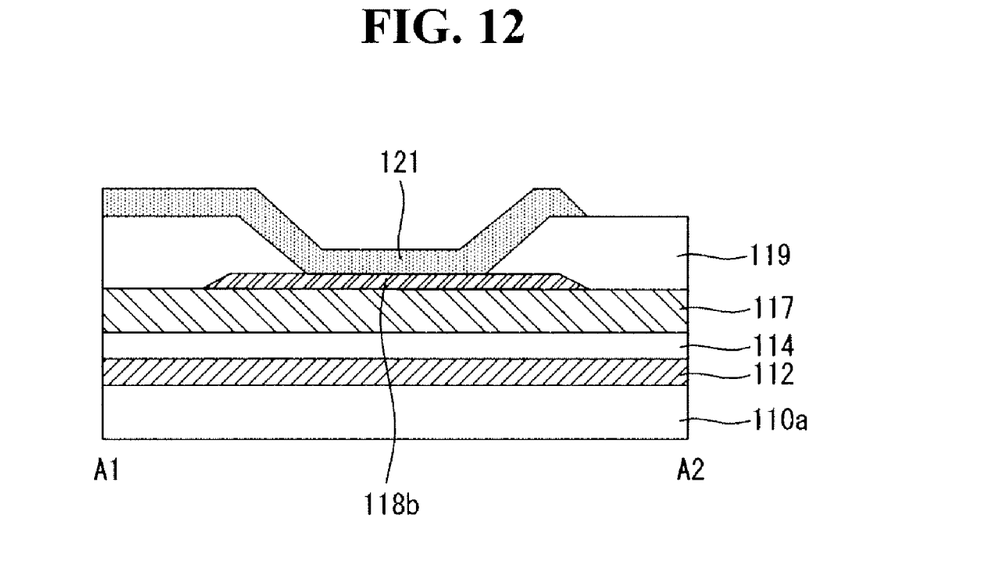

FIGS. 11 and 12 illustrate the structure of a contact unit and a contact electrode according to a third exemplary embodiment of the invention.

As shown in FIGS. 3 and 11, a contact electrode 118*b* (CE) is formed on the substrate 110*a* defined as the non-display area NA using the same process and the same material as the lower electrode 118. Because the contact electrode 118*b* (CE) is formed using the same process and the same material as the lower electrode 118, two insulating layers 112 and 114 are formed under the contact electrode 118*b* (CE). The two insulating layers 112 and 114 are the first insulating layer 112 and the second insulating layer 114. A contact unit 119 (CA) includes one insulating layer. The one insulating layer is formed using the same process and the same material as the fifth insulating layer 119. The contact unit 119 (CA) covers an edge portion of the contact electrode 118*b* (CE) and exposes a middle portion of the contact electrode 118*b* (CE).

As shown in FIGS. 3 and 12, the contact electrode 118*b* (CE) is formed on the substrate 110*a* defined as the non-display area NA using the same process and the same material as the lower electrode 118. Because the contact electrode 118*b* (CE) is formed using the same process and the same material as the lower electrode 118, three insulating layers 112, 114 and 117 are formed under the contact electrode 118*b* (CE). The three insulating layers 112, 114 and 117 are the first insulating layer 112, the second insulating layer 114, and the fourth insulating layer 117. A contact unit 119 (CA) includes one insulating layer. The one insulating layer is formed using the same process and the same material as the fifth insulating layer 119. The contact unit 119 (CA) covers an edge portion of the contact electrode 118*b* (CE) and exposes a middle portion of the contact electrode 118*b* (CE).

Because the upper electrode 121 is electrically connected to the contact electrode 118*b* (CE) through the middle portion of the contact electrode 118*b* (CE) having a single-layered structure based on the above-described structure, the upper electrode 121 may smoothly contact the contact electrode 118*b* (CE) and an electric field may be prevented from being concentrated on an upper edge of the contact electrode 118*b* (CE).

<Fourth Exemplary Embodiment>

Figure 13:
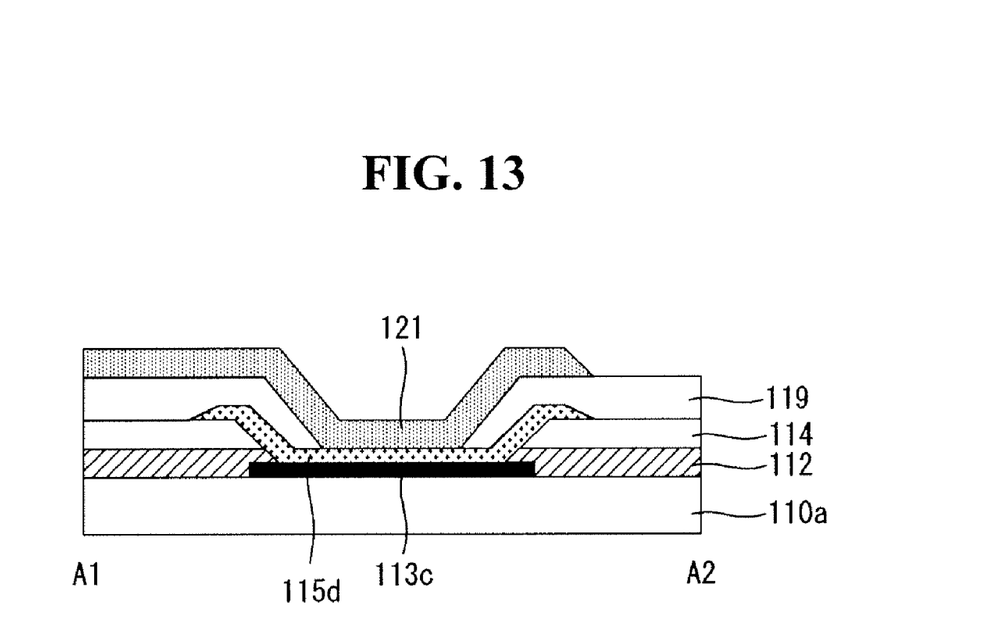
FIGS. 13 to 15 illustrate the structure of a contact unit and a contact electrode according to a fourth exemplary embodiment of the invention.
Figure 14:
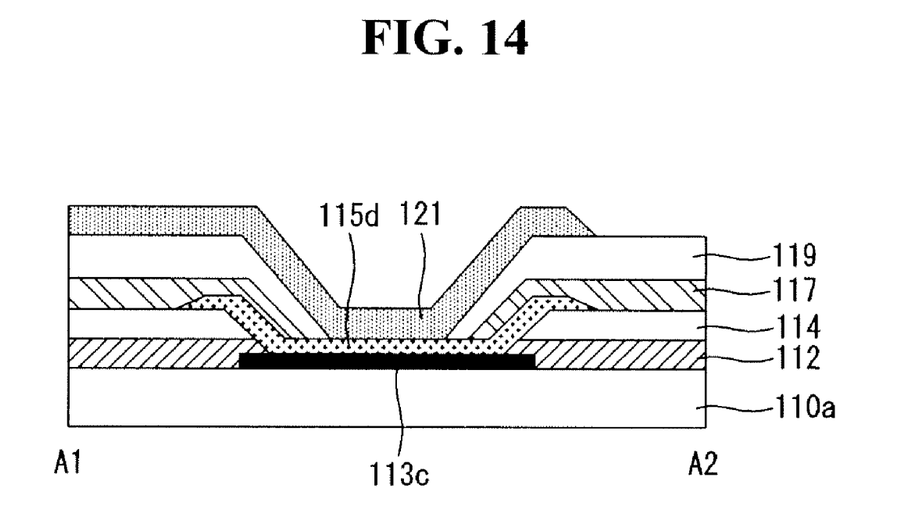
Figure 15:
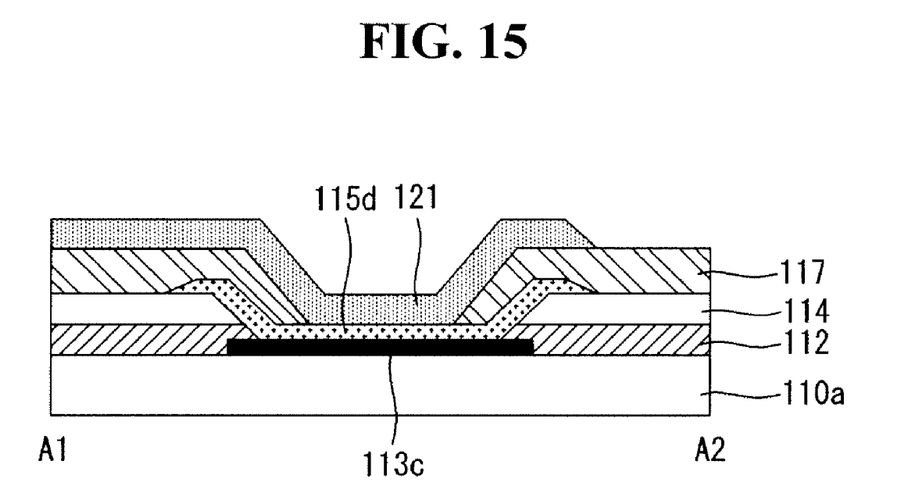

FIGS. 13 to 15 illustrate the structure of a contact unit and a contact electrode according to a fourth exemplary embodiment of the invention.

As shown in FIGS. 3 and 13, contact electrodes 113*c* and 115*d* (CE) are formed on the substrate 110*a* defined as the non-display area NA using the same process and the same material as the first and second gate electrodes 113*a* and 113*b* and the source and drain electrodes 115*a* and 115*b*. Thus, the upper contact electrode 115*d* (CE) is formed on the first and second insulating layers 112 and 114 exposing a middle portion of the lower contact electrode 113*c* (CE). A contact unit 119 (CA) includes one insulating layer. The one insulating layer is formed using the same process and the same material as the fifth insulating layer 119. The contact unit 119 (CA) covers an edge portion of the upper contact electrode 115*d* and exposes a middle portion of the upper contact electrode 115*d*.

As shown in FIGS. 3 and 14, the contact electrodes 113*c* and 115*d* (CE) are formed on the substrate 110*a* defined as the non-display area NA using the same process and the same material as the first and second gate electrodes 113*a* and 113*b* and the source and drain electrodes 115*a* and 115*b*. Thus, the upper contact electrode 115*d* (CE) is formed on the first and second insulating layers 112 and 114 exposing a middle portion of the lower contact electrode 113*c* (CE). Contact units 117 and 119 (CA) include two insulating layers. The two insulating layers are formed using the same process and the same material as the fourth and fifth insulating layers 117 and 119. The contact units 117 and 119 (CA) cover an edge portion of the upper contact electrode 115*d* and expose a middle portion of the upper contact electrode 115*d*.

As shown in FIGS. 3 and 15, the contact electrodes 113*c* and 115*d* (CE) are formed on the substrate 110*a* defined as the non-display area NA using the same process and the same material as the first and second gate electrodes 113*a* and 113*b* and the source and drain electrodes 115*a* and 115*b*. Thus, the upper contact electrode 115*d* (CE) is formed on the first and second insulating layers 112 and 114 exposing a middle portion of the lower contact electrode 113*c* (CE). A contact unit 117 (CA) includes one insulating layer. The one insulating layer is formed using the same process and the same material as the fourth insulating layer 117. The contact unit 117 (CA) covers an edge portion of the upper contact electrode 115*d* and exposes a middle portion of the upper contact electrode 115*d*.

Because the upper electrode 121 is electrically connected to the contact electrodes 113*c* and 115*d* (CE) through the middle portion of the contact electrodes 113*c* and 115*d* (CE) having a two-layered structure based on the above-described structure, the upper electrode 121 may smoothly contact the contact electrodes 113*c* and 115*d* (CE) and an electric field may be prevented from being concentrated on an upper edge of the contact electrodes 113*c* and 115*d* (CE).

<Fifth Exemplary Embodiment>

Figure 16:
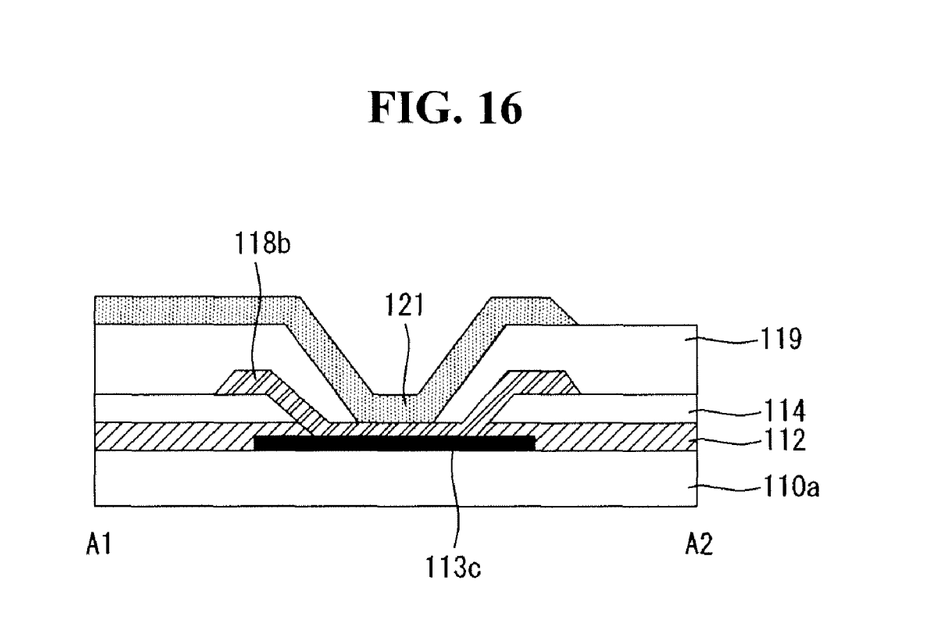
FIGS. 16 and 17 illustrate the structure of a contact unit and a contact electrode according to a fifth exemplary embodiment of the invention.
Figure 17:
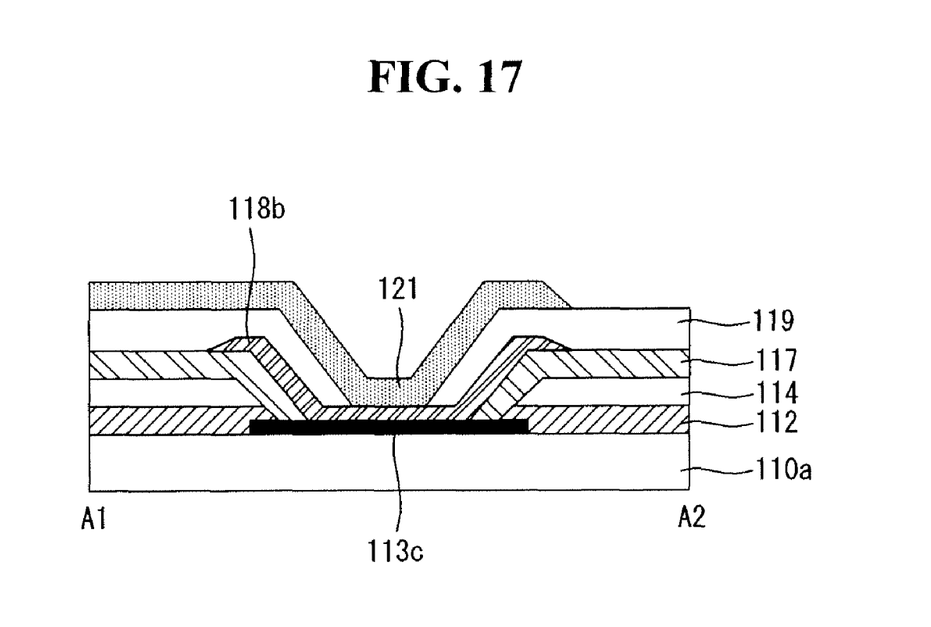

FIGS. 16 and 17 illustrate the structure of a contact unit and a contact electrode according to a fifth exemplary embodiment of the invention.

As shown in FIGS. 3 and 16, contact electrodes 113*c* and 118*b* (CE) are formed on the substrate 110*a* defined as the non-display area NA using the same process and the same material as the first and second gate electrodes 113*a* and 113*b* and the lower electrode 118. Thus, the upper contact electrode 118*b* (CE) is formed on the first and second insulating layers 112 and 114 exposing a middle portion of the lower contact electrode 113*c* (CE). A contact unit 119 (CA) includes one insulating layer. The one insulating layer is formed using the same process and the same material as the fifth insulating layer 119. The contact unit 119 (CA) covers an edge portion of the upper contact electrode 118*b* and exposes a middle portion of the upper contact electrode 118*b*.

As shown in FIGS. 3 and 17, the contact electrodes 113*c* and 118*b* (CE) are formed on the substrate 110*a* defined as the non-display area NA using the same process and the same material as the first and second gate electrodes 113*a* and 113*b* and the lower electrode 118. Thus, the upper contact electrode 118*b* (CE) is formed on the first, second, and the fourth insulating layers 112, 114, and 117 exposing a middle portion of the lower contact electrode 113c (CE). A contact unit 119 (CA) includes one insulating layer. The one insulating layer is formed using the same process and the same material as the fifth insulating layer 119. The contact unit 119 (CA) covers an edge portion of the upper contact electrode 118b and exposes a middle portion of the upper contact electrode 118b.

Because the upper electrode 121 is electrically connected to the contact electrodes 113c and 118b (CE) through the middle portion of the contact electrodes 113c and 118b (CE) having a two-layered structure based on the above-described structure, the upper electrode 121 may smoothly contact the contact electrodes 113c and 118b (CE) and an electric field may be prevented from being concentrated on an upper edge of the contact electrodes 113c and 118b (CE).

<Sixth Exemplary Embodiment>

Figure 18:
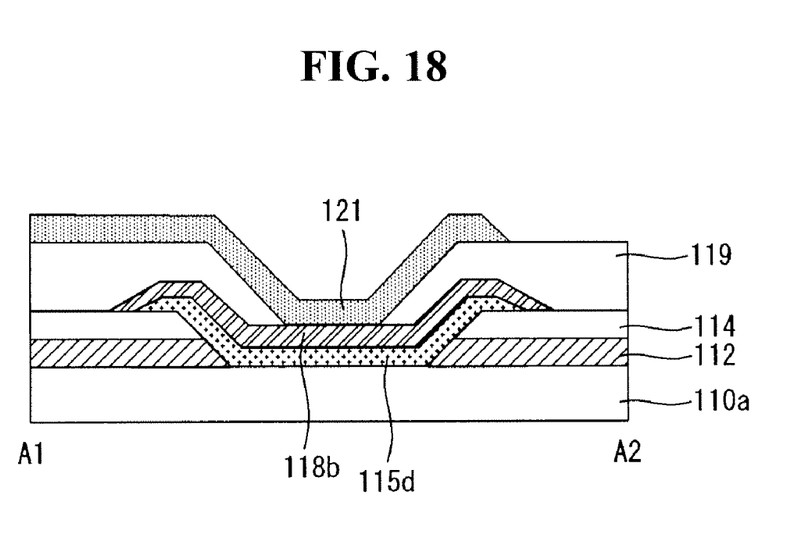
FIGS. 18 and 19 illustrate the structure of a contact unit and a contact electrode according to a sixth exemplary embodiment of the invention.
Figure 19:
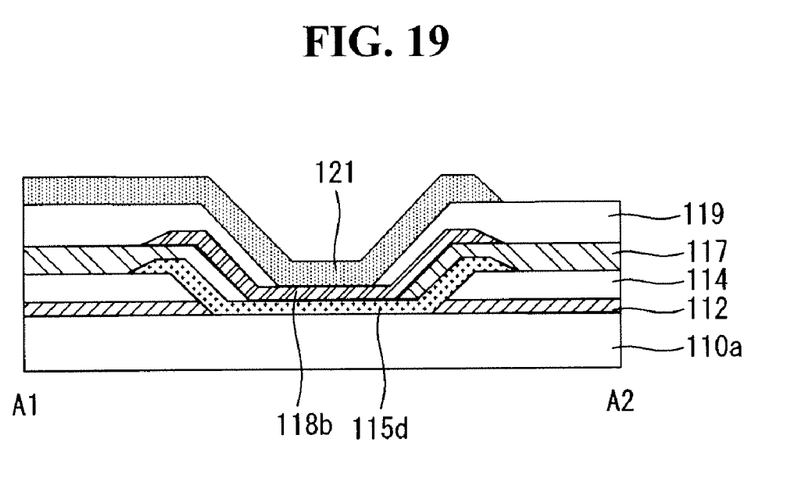

FIGS. 18 and 19 illustrate the structure of a contact unit and a contact electrode according to a sixth exemplary embodiment of the invention.

As shown in FIGS. 3 and 18, contact electrodes 115d and 118b (CE) are formed on the substrate 110a defined as the non-display area NA using the same process and the same material as the source and drain electrodes 115a and 115b and the lower electrode 118. Thus, the upper contact electrode 118b (CE) is formed on the first and second insulating layers 112 and 114 exposing a middle portion of the lower contact electrode 115d (CE). A contact unit 119 (CA) includes one insulating layer. The one insulating layer is formed using the same process and the same material as the fifth insulating layer 119. The contact unit 119 (CA) covers an edge portion of the upper contact electrode 118b and exposes a middle portion of the upper contact electrode 118b.

As shown in FIGS. 3 and 19, the contact electrodes 115d and 118b (CE) are formed on the substrate 110a defined as the non-display area NA using the same process and the same material as the source and drain electrodes 115a and 115b and the lower electrode 118. Thus, the upper contact electrode 118b (CE) is formed on the first, second, and fourth insulating layers 112, 114 and 117 exposing a middle portion of the lower contact electrode 115d (CE). In the sixth exemplary embodiment, the fourth insulating layer 117 is formed between the upper contact electrode 118b and the lower contact electrode 115d to cover an edge portion of the lower contact electrode 115d and to expose the middle portion of the lower contact electrode 115d. A contact unit 119 (CA) includes one insulating layer. The one insulating layer is formed using the same process and the same material as the fifth insulating layer 119. The contact unit 119 (CA) covers an edge portion of the upper contact electrode 118b and exposes a middle portion of the upper contact electrode 118b.

Because the upper electrode 121 is electrically connected to the contact electrodes 113c and 118b (CE) through the middle portion of the contact electrodes 115d and 118b (CE) having a two-layered structure based on the above-described structure, the upper electrode 121 may smoothly contact the contact electrodes 115d and 118b (CE) and an electric field may be prevented from being concentrated on an upper edge of the contact electrodes 115d and 118b (CE).

<Seventh Exemplary Embodimen>

Figure 20:
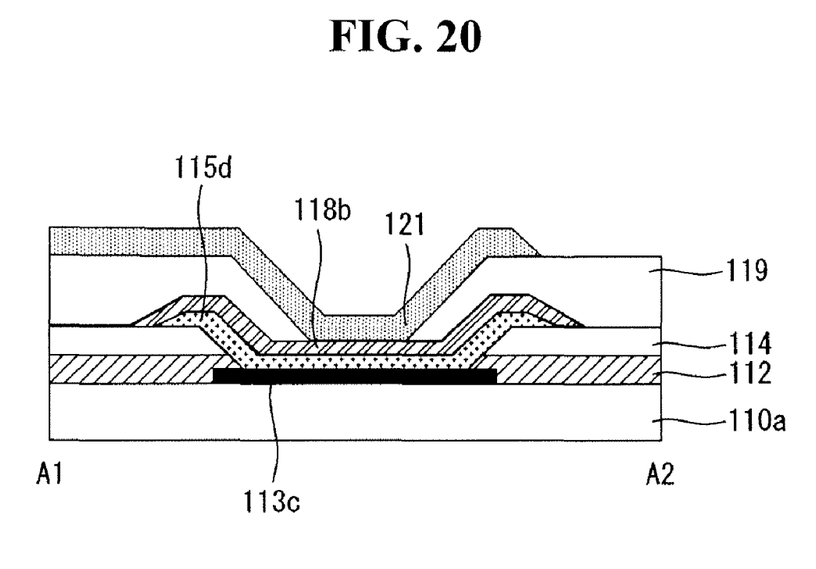
FIGS. 20 and 21 illustrate the structure of a contact unit and a contact electrode according to a seventh exemplary embodiment of the invention.
Figure 21:
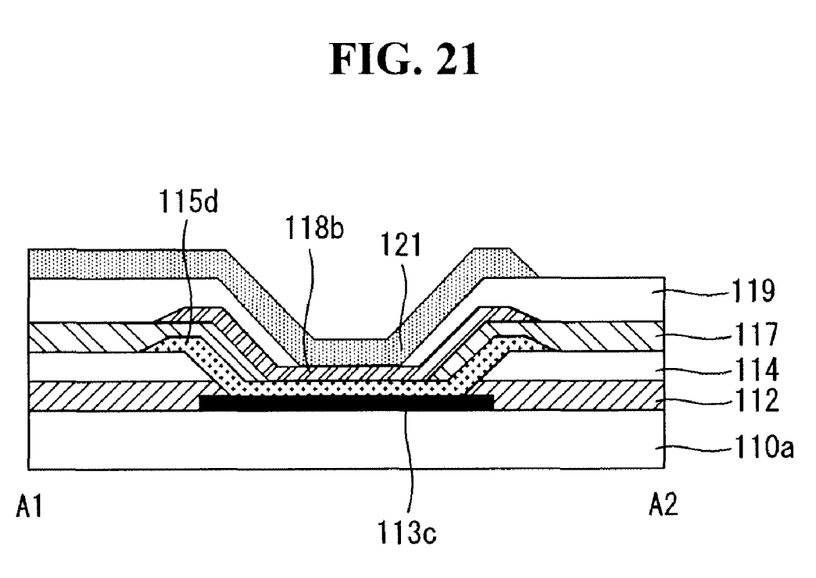

FIGS. 20 and 21 illustrate the structure of a contact unit and a contact electrode according to a seventh exemplary embodiment of the invention.

As shown in FIGS. 3 and 20, contact electrodes 113c, 115d and 118b (CE) are formed on the substrate 110a defined as the non-display area NA using the same process and the same material as the first and second gate electrodes 113a and 113b, the source and drain electrodes 115a and 115b, and the lower electrode 118. Thus, the middle and upper contact electrodes 115d and 118b (CE) are formed on the first and second insulating layers 112 and 114 exposing a middle portion of the lower contact electrode 113c (CE). A contact unit 119 (CA) includes one insulating layer. The one insulating layer is formed using the same process and the same material as the fifth insulating layer 119. The contact unit 119 (CA) covers an edge portion of the upper contact electrode 118b and exposes a middle portion of the upper contact electrode 118b.

As shown in FIGS. 3 and 21, the contact electrodes 113c, 115d and 118b (CE) are formed on the substrate 110a defined as the non-display area NA using the same process and the same material as the first and second gate electrodes 113a and 113b, the source and drain electrodes 115a and 115b, and the lower electrode 118. Thus, the middle and upper contact electrodes 115d and 118b (CE) are formed on the first, second, and fourth insulating layers 112, 114 and 117 exposing a middle portion of the lower contact electrode 113c (CE). In the seventh exemplary embodiment, the fourth insulating layer 117 is formed between the upper contact electrode 118b and the middle contact electrode 115d to cover an edge portion of the middle contact electrode 115d and to expose the middle portion of the middle contact electrode 115d. A contact unit 119 (CA) includes one insulating layer. The one insulating layer is formed using the same process and the same material as the fifth insulating layer 119. The contact unit 119 (CA) covers an edge portion of the upper contact electrode 118b and exposes a middle portion of the upper contact electrode 118b.

Because the upper electrode 121 is electrically connected to the contact electrodes 113c, 115d and 118b (CE) through the middle portion of the contact electrodes 113c, 115d and 118b (CE) having a three-layered structure based on the above-described structure, the upper electrode 121 may smoothly contact the contact electrodes 113c, 115d and 118b (CE) and an electric field may be prevented from being concentrated on an upper edge of the contact electrodes 113c, 115d and 118b (CE).

As described above, in the OLED display according to the exemplary embodiments of the invention, because the contact electrode formed in the non-display area of the panel smoothly contacts the upper electrode formed in the display area of the panel, the short circuit between the contact electrode and the upper electrode can be prevented and the damage of the contact electrode resulting form the concentration of the electric field on the upper edge of the contact electrode can be prevented. Further, the exemplary embodiments of the invention can provide the structure of the contact electrode capable of reducing the line resistance.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting diode display comprising:
a substrate including a display area and a non-display area;
subpixels arranged in the display area in a matrix form;
a contact electrode that is formed in the non-display area, transfers a power received from the outside, and includes at least one of electrodes included in each subpixel; and
a contact unit including at least one of insulating layers included in each subpixel, the contact unit exposing a portion of the contact electrode,
wherein an upper electrode included in each subpixel is formed in the display area and the non-display area and is electrically connected to the contact electrode through the contact unit,
wherein the contact electrode is formed as a gate electrode included in each subpixel,
wherein the insulating layer formed in the contact unit includes at least three of the insulating layers included in each subpixel.

2. The organic light emitting diode display of claim 1, wherein the contact electrode is formed using the same process and the same material as at least one of the electrodes included in each subpixel,
wherein the insulating layer formed in the contact unit is formed using the same process and the same material as at least one of the insulating layers included in each subpixel.

3. The organic light emitting diode display of claim 1, wherein at least two insulating layers are formed under the contact electrode, and the contact electrode is formed as a source electrode and a drain electrode included in each subpixel,
wherein the insulating layer formed in the contact unit includes at least one of the insulating layers included in each subpixel.

4. The organic light emitting diode display of claim 1, wherein the contact electrode is formed as a gate electrode, a source electrode, and a drain electrode included in each subpixel,
wherein the insulating layer formed in the contact unit includes at least one of the insulating layers included in each subpixel.

5. The organic light emitting diode display of claim 1, wherein the contact electrode is formed as a gate electrode, a source electrode, a drain electrode, and a lower electrode included in each subpixel.

6. An organic light emitting diode display comprising:
a substrate including a display area and a non-display area;
subpixels arranged in the display area in a matrix form;
a contact electrode that is formed in the non-display area, transfers a power received from the outside, and includes at least one of electrodes included in each subpixel; and
a contact unit including at least one of insulating layers included in each subpixel, the contact unit exposing a portion of the contact electrode,
wherein an upper electrode included in each subpixel is formed in the display area and the non-display area and is electrically connected to the contact electrode through the contact unit,
wherein at least three insulating layers are formed under the contact electrode, and the contact electrode is formed as a lower electrode included in each subpixel,
wherein the insulating layer formed in the contact unit includes at least one of the insulating layers included in each subpixel.

7. An organic light emitting diode display comprising:
a substrate including a display area and a non-display area;
subpixels arranged in the display area in a matrix form;
a contact electrode that is formed in the non-display area, transfers a power received from the outside, and includes at least one of electrodes included in each subpixel; and
a contact unit including at least one of insulating layers included in each subpixel, the contact unit exposing a portion of the contact electrode,
wherein an upper electrode included in each subpixel is formed in the display area and the non-display area and is electrically connected to the contact electrode through the contact unit,
wherein the contact electrode is formed as a gate electrode and a lower electrode included in each subpixel,
wherein the insulating layer formed in the contact unit includes at least three of the insulating layers included in each subpixel.

8. An organic light emitting diode display comprising:
a substrate including a display area and a non-display area;
subpixels arranged in the display area in a matrix form;
a contact electrode that is formed in the non-display area, transfers a power received from the outside, and includes at least one of electrodes included in each subpixel; and
a contact unit including at least one of insulating layers included in each subpixel, the contact unit exposing a portion of the contact electrode,
wherein an upper electrode included in each subpixel is formed in the display area and the non-display area and is electrically connected to the contact electrode through the contact unit,
wherein the contact electrode is formed as a source electrode, a drain electrode, and a lower electrode included in each subpixel,
wherein the insulating layer formed in the contact unit includes at least three of the insulating layers included in each subpixel.

* * * * *